(12) United States Patent
Saito et al.

(10) Patent No.: US 11,404,437 B2
(45) Date of Patent: Aug. 2, 2022

(54) SEMICONDUCTOR DEVICE AND METHOD OF MANUFACTURING THE SAME (71) Applicant: Kioxia Corporation, Tokyo (JP)

(72) Inventors: Yuta Saito, Yokkaichi Mie (JP); Shinji Mori, Nagoya Aichi (JP); Keiichi Sawa, Yokkaichi Mie (JP); Kazuhisa Matsuda, Yokkaichi Mie (JP); Kazuhiro Matsuo, Kuwana Mie (JP); Hiroyuki Yamashita, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 1 day.

(21) Appl. No.: 16/993,627

(22) Filed: Aug. 14, 2020

(65) Prior Publication Data

US 2020/0373328 A1 Nov. 26, 2020

Related U.S. Application Data

(62) Division of application No. 16/285,068, filed on Feb. 25, 2019, now Pat. No. 10,777,573.

(30) Foreign Application Priority Data

May 30, 2018 (JP) .............................. JP2018-103578

(51) Int. Cl.
*H01L 27/11582* (2017.01)
*H01L 21/324* (2006.01)
(Continued)

(52) U.S. Cl.
CPC ...... *H01L 27/11582* (2013.01); *H01L 21/324* (2013.01); *H01L 23/53295* (2013.01); *H01L 29/40117* (2019.08)

(58) Field of Classification Search
CPC ......... H01L 27/11582; H01L 29/40117; H01L 21/324; H01L 23/53295
(Continued)

(56) References Cited

U.S. PATENT DOCUMENTS 5,550,070 A 8/1996 Funai et al.
6,093,809 A 7/2000 Cech et al.
(Continued)

FOREIGN PATENT DOCUMENTS

JP H09-148245 A 6/1997
JP 2003-100629 A 4/2003

OTHER PUBLICATIONS

W. Knaepen et al., "In-situ X-ray Diffraction study of Metal Induced Crystallization of amorphous silicon", Elsevier, Science Direct, Thin Solid Films 516, 2008.

*Primary Examiner* — Tu-Tu V Ho
(74) *Attorney, Agent, or Firm* — Foley & Lardner LLP (57) ABSTRACT

A semiconductor device includes a semiconductor layer containing metal atoms, a charge storage layer provided on a surface of the semiconductor layer via a first insulating film, and an electrode layer provided on a surface of the charge storage layer via a second insulating film. The thickness of the first insulating film is 5 nm or more and 10 nm or less. The concentration of the metal atoms in the semiconductor layer is $5.0 \times 10^{17}$ [EA/cm$^3$] or higher and $1.3 \times 10^{20}$ [EA/cm$^3$] or lower.

8 Claims, 6 Drawing Sheets

(51) Int. Cl.
*H01L 23/532* (2006.01)
*H01L 21/28* (2006.01)

(58) Field of Classification Search
USPC .......................................................... 257/324
See application file for complete search history.

(56) References Cited

U.S. PATENT DOCUMENTS

| | | | |
|---|---|---|---|
| 6,346,437 B1 | 2/2002 | Maekawa et al. | |
| 2002/0125480 A1* | 9/2002 | Nakamura | H01L 27/1277 257/66 |
| 2004/0124469 A1* | 7/2004 | Makita | H01L 29/06 257/347 |

* cited by examiner

SEMICONDUCTOR DEVICE AND METHOD OF MANUFACTURING THE SAME

CROSS-REFERENCE TO RELATED APPLICATION

This application is a Divisional of U.S. application Ser. No. 16/285,068, filed Feb. 25, 2019, which claims priority from Japanese Patent Application No. 2018-103578, filed May 30, 2018, the entire contents of which are incorporated herein by reference.

FIELD

Embodiments described herein relate a semiconductor device and a method of manufacturing the same.

BACKGROUND

The characteristics of a channel semiconductor layer of a semiconductor memory significantly affect the performance of a memory cell. For example, as the mobility of the channel semiconductor layer decreases, the threshold voltage of the memory cell increases, which results in an increase in the operation voltage of the memory cell.

DETAILED DESCRIPTION

At least one embodiment provides a semiconductor device and a method for manufacture thereof which allow improvement of the characteristics of a semiconductor layer.

In general, according to at least one embodiment, a semiconductor device includes a semiconductor layer containing metal atoms, a charge storage layer provided on a surface of the semiconductor layer via a first insulating film, and an electrode layer provided on a surface of the charge storage layer via a second insulating film. The thickness of the first insulating film is 5 nm or more and 10 nm or less. The concentration of the metal atoms in the semiconductor layer is $5.0 \times 10^{17}$ [EA/cm$^3$] or higher and $1.3 \times 10^{20}$ [EA/cm$^3$] or lower.

Hereinafter, embodiments of the present disclosure will be described with reference to the drawings. In FIGS. 1 to 6B, corresponding or similar configurations are given the same reference signs, and redundant description thereof will be omitted.

First Embodiment

Figure 1:
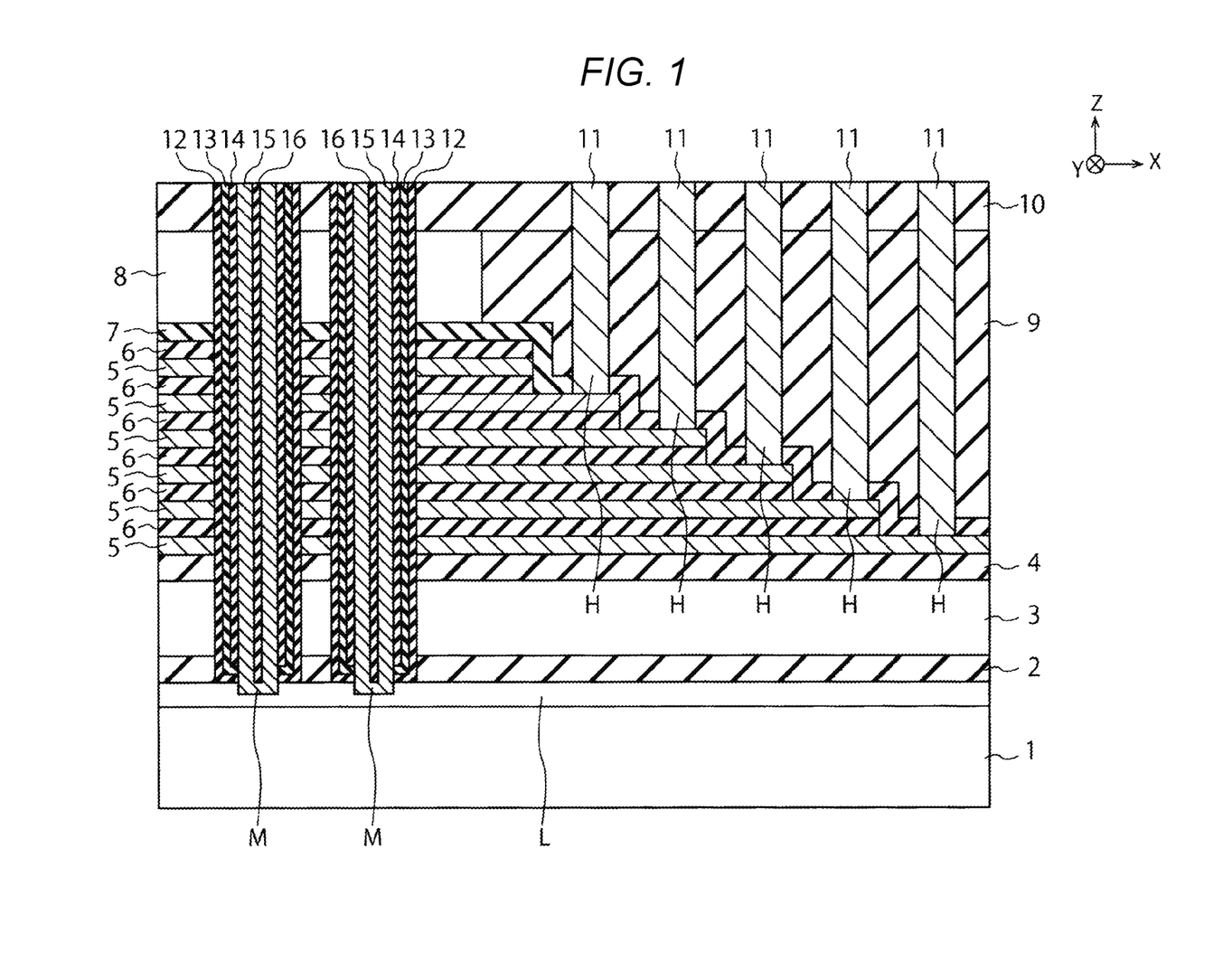
FIG. 1 is a cross-sectional view illustrating a structure of a semiconductor device of a first embodiment.

FIG. 1 is a cross-sectional view illustrating a structure of a semiconductor device of a first embodiment. The semiconductor device illustrated in FIG. 1 includes a three-dimensional semiconductor memory.

The semiconductor device illustrated in FIG. 1 includes a substrate 1, a lower insulating film 2, a source-side conductive layer 3, an upper insulating film 4, a plurality of electrode layers 5, a plurality of insulating layers 6, a cover insulating film 7, a drain-side conductive layer 8, a first interlayer insulating film 9, a second interlayer insulating film 10, a plurality of contact plugs 11, a block insulating film 12 which is an example of a second insulating film, a charge storage layer 13, a tunnel insulating film 14 which is an example of a first insulating film, a channel semiconductor layer 15, and a core insulating film 16.

The substrate 1 is, for example, a semiconductor substrate such as a Si (silicon) substrate. In FIG. 1, an X direction and a Y direction are illustrated which are perpendicular to each other and are parallel with the surface of the substrate 1, and a Z direction is illustrated which is perpendicular to the surface of the substrate 1. In this specification, a +Z direction is considered as an upper direction, and −Z direction is considered as a lower direction. The −Z direction may be matched with the gravity direction, or may be not matched with the gravity direction.

The lower insulating film 2 is formed on a diffusion layer L which is formed in the substrate 1. The source-side conductive layer 3 is formed on the lower insulating film 2. The upper insulating film 4 is formed on the source-side conductive layer 3.

The plurality of electrode layers 5 and the plurality of insulating layers 6 are alternately stacked on the upper insulating film 4. The electrode layer 5 is, for example, a metal layer, and serves as a word line or a select line. The number of electrode layers 5 is, for example, 64 or more. The insulating layer 6 is, for example, a SiO$_2$ film (silicon oxide film). The number of insulating layers 6 is, for example, 64 or more. FIG. 1 illustrates memory holes M which pass through the electrode layers 5 and the insulating layers 6, and illustrates contact holes H which are formed on step regions of the electrode layers 5 and the insulating layer 6.

The cover insulating film 7 is formed on these electrode layers 5 and the insulating layers 6. The drain-side conductive layer 8 is formed on the cover insulating film 7 so as to be adjacent to the step regions. The first interlayer insulating film 9 is formed on the cover insulating film 7 to fill the space over each step region. The second interlayer insulating film 10 is formed on the drain-side conductive layer 8 and the first interlayer insulating film 9.

The plurality of contact plugs 11 are formed inside the contact holes H that pass through the cover insulating film 7, the first interlayer insulating film 9, and the second interlayer insulating film 10. These contact plugs 11 are electrically connected to different electrode layers 5, respectively. The contact plug 11 is formed of a barrier metal layer such as a titanium (Ti) containing layer and a plug material layer such as a tungsten (W) layer.

The block insulating film 12, the charge storage layer 13, the tunnel insulating film 14, the channel semiconductor layer 15, and the core insulating film 16 are formed in this order on the side surface of the memory hole M which passes through the lower insulating film 2, the source-side conductive layer 3, the upper insulating film 4, the electrode layer 5, the insulating layer 6, the cover insulating film 7, the drain-side conductive layer 8, and the second interlayer insulating film 10. The block insulating film 12 is, for example, a SiO$_2$ film. The charge storage layer 13 is, for example, a silicon nitride film (SiN film), but may be a semiconductor layer such as a polysilicon layer. The tunnel insulating film 14 is, for example, a SiO$_2$ film. The channel semiconductor layer 15 is, for example, a polysilicon layer, and is electrically connected to the substrate 1. The core insulating film 16 is, for example, a SiO$_2$ film.

The block insulating film 12, the charge storage layer 13, the tunnel insulating film 14, the channel semiconductor layer 15, and the core insulating film 16 are formed in the following order for example. First, the block insulating film 12, the charge storage layer 13, and the tunnel insulating film 14 are formed in this order on the side surface and the bottom surface of the memory hole M. Next, the tunnel insulating film 14, the charge storage layer 13, and the block insulating film 12 are removed from the bottom surface of the memory hole M. Thereafter, the channel semiconductor layer 15 and the core insulating film 16 are buried in the memory hole M in this order.

Next, the channel semiconductor layer 15 and the tunnel insulating film 14 of at least one embodiment will be described in detail.

The channel semiconductor layer 15 of this embodiment contains a minute amount of metal atoms. The concentration of the metal atoms in the channel semiconductor layer 15 is, for example, $5.0 \times 10^{17}$ [EA/cm$^3$] or higher and $1.3 \times 10^{20}$ [EA/cm$^3$] or lower. In at least one embodiment, these metal atoms are substantially evenly distributed in the channel semiconductor layer 15. These metal atoms are, for example, nickel (Ni) atoms. In addition, the thickness of the tunnel insulating film 14 of at least one embodiment is 5 nm or more and 10 nm or less.

In at least one embodiment, the metal atoms are deposited on the surface of the channel semiconductor layer 15, and then the channel semiconductor layer 15 is crystallized. Therefore, the channel semiconductor layer 15 can be crystalized at a low temperature, and the particle diameter of crystal grains in the channel semiconductor layer 15 can be made large. As a result, a mobility of the channel semiconductor layer 15 can be increased, and a threshold voltage of a memory cell of the three-dimensional semiconductor memory can be lowered. When the channel semiconductor layer 15 is crystalized, these metal atoms enter the channel semiconductor layer 15.

In order to crystallize the channel semiconductor layer 15 without deposition of metal atoms on the surface thereof, it is necessary to crystalize the channel semiconductor layer 15 at a high temperature. For example, when the channel semiconductor layer 15 is crystallized at 650° C. to 800° C., the particle diameter of the crystal grains in the channel semiconductor layer 15 becomes about 200 nm. On the other hand, according to at least one embodiment, the channel semiconductor layer 15 can be crystalized at 500° C. to 600° C., so that the particle diameter of the crystal grains in the channel semiconductor layer 15 can be 2,000 nm or more, for example. This particle diameter can be obtained, for example, by depositing metal atoms on the surface of the channel semiconductor layer 15 such that the concentration of the metal atoms in the channel semiconductor layer 15 falls within the above range.

If the amount of metal atoms deposited on the surface of the channel semiconductor layer 15 is too small, the concentration of the metal atoms in the channel semiconductor layer 15 will be less than $5.0 \times 10^{17}$ [EA/cm$^3$]. In this case, the particle diameter of the crystal grains in the channel semiconductor layer 15 will fail to be sufficiently large. On the other hand, if the amount of metal atoms deposited on the surface of the channel semiconductor layer 15 are too large, the metal atoms can easily enter the tunnel insulating film 14. In this case, a leakage current may occur in the tunnel insulating film 14. Therefore, the concentration of the metal atoms in the channel semiconductor layer 15 of this embodiment is set to $5.0 \times 10^{17}$ [EA/cm$^3$] or higher and $1.3 \times 10^{20}$ [EA/cm$^3$] or lower.

If the concentration is $5.0 \times 10^{17}$ [EA/cm$^3$] or higher, for example, the particle diameter of 2,000 nm or more can be obtained. On the other hand, if the concentration is $1.3 \times 10^{20}$ [EA/cm$^3$] or lower, for example, the leakage current can be prevented in the tunnel insulating film 14. The latter concentration will be described below in detail with reference to FIG. 2.

The metal atoms of at least one embodiment are, for example, Ni atoms, but other metal atoms may be employed. For example, the metal atoms of this embodiment desirably include at least gold (Au), aluminum (Al), copper (Cu), silver (Ag), palladium (Pd), nickel (Ni), or platinum (Pt) (first example). In addition, for example, the metal atoms of this embodiment may include at least manganese (Mn), rhodium (Rh), cobalt (Co), iron (Fe), chromium (Cr), titanium (Ti), niobium (Nb), iridium (Ir), tantalum (Ta), rhenium (Re), molybdenum (Mo), vanadium (V), hafnium (Hf), ruthenium (Ru), zirconium (Zr), or tungsten (W) (second example). The metal atoms of the first example and the metal atoms of the second example both have an effect of lowering the crystallization temperature of the channel semiconductor layer 15, but the first example generally has an effect larger than the second example.

For example, using Al or Ti is advantageous in that an insulating film can be formed on the surface of the channel semiconductor layer 15 by performing oxidation treatment or nitriding treatment after crystalizing the channel semiconductor layer 15. When Al or Ti exists in the channel semiconductor layer 15, short channel characteristics of the tunnel insulating film 14 and the channel semiconductor layer 15 may worsen. However, if the channel semiconductor layer 15 containing Al is oxidized or nitrided, an AlO$_x$ film or an AiN film is formed on the surface of the channel semiconductor layer 15, serving as an insulating film, so that it is possible to prevent worsening of short channel characteristics. Similarly, if the channel semiconductor layer 15 containing Ti is oxidized, a TiO$_x$ film is formed on the surface of the channel semiconductor layer 15, serving as an insulating film, so that it is possible to prevent worsening of short channel characteristics.

Figure 2:
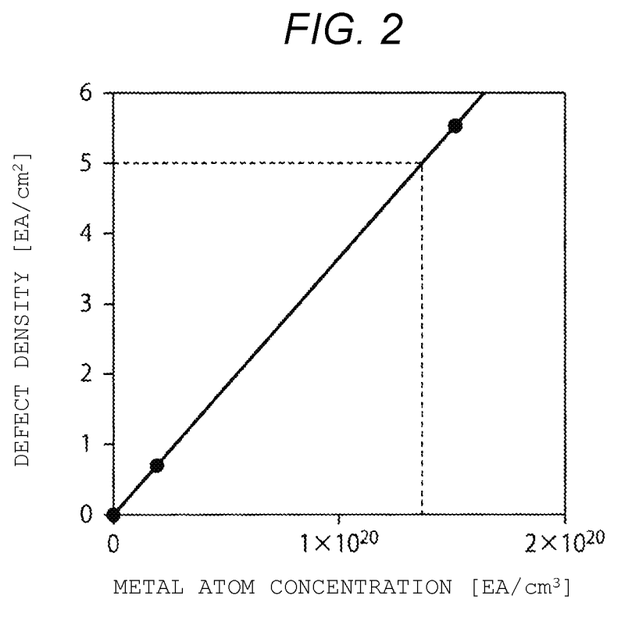
FIG. 2 is a graph for describing metal atoms in a channel semiconductor layer of the first embodiment.

FIG. 2 is a graph for describing the metal atoms in the channel semiconductor layer 15 of the first embodiment.

The horizontal axis of FIG. 2 represents the concentration of the metal atoms (Ni atoms) in the channel semiconductor layer 15. The vertical axis of FIG. 2 represents two-dimensional concentration of a defect in the tunnel insulating film 14. Specifically, the two-dimensional concentration indicates the number of defects existing in the film thickness direction of each unit area when the side surface of the tunnel insulating film 14 is divided into unit areas. FIG. 2 is a graph obtained by plotting the results of these concentration measurements and connecting the plotted points with a straight line. According to FIG. 2, the defect density in the tunnel insulating film 14 is increased as the concentration of the metal atoms in the channel semiconductor layer 15 is increased.

The tunnel insulating film 14 of at least one embodiment is a thin film, and specifically has a thickness of 5 nm or more and 10 nm or less. In a case where the tunnel insulating film 14 is a thin film, there is a high possibility that the leakage current occurs in the tunnel insulating film 14. Therefore, in order to prevent such a leakage current, it is desirable to prevent defects from being generated in the tunnel insulating film 14 as much as possible. Specifically, the defect density in the tunnel insulating film 14 is desirably controlled to be 5.0 [EA/cm$^2$] or lower. Therefore, if this defect density is located in the graph of FIG. 2, the concentration of the metal atoms in the channel semiconductor layer 15 is found to be desirably set to $1.3 \times 10^{20}$ [EA/cm$^3$] or lower.

For this reason, the concentration of the metal atoms in the channel semiconductor layer 15 of this embodiment is set to be, for example, $5.0 \times 10^{17}$ [EA/cm$^3$] or higher and $1.3 \times 10^{20}$ [EA/cm$^3$] or lower. Thereby, it is possible to keep the particle diameter of the crystal grains in the channel semiconductor layer 15 to 2,000 nm or more while preventing the leakage current from occurring in the tunnel insulating film 14.

FIGS. 3A to 3D are schematic views for describing the particle diameter of the crystal grains in the channel semiconductor layer 15 of the first embodiment.

Figure 3A:
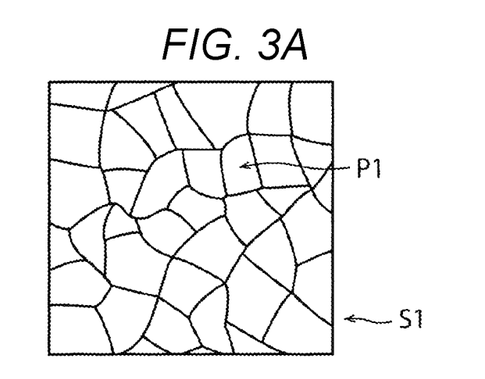
FIGS. 3A to 3D are schematic views for describing the particle diameter of crystal grains in the channel semiconductor layer of the first embodiment.
Figure 3B:
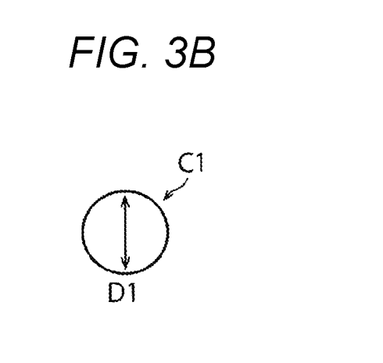

FIG. 3A illustrates a certain cross section S1 of the channel semiconductor layer 15 in a case where the channel semiconductor layer 15 is crystalized without deposition of metal atoms on the surface thereof. P1 in FIG. 3A represents a certain crystal grain P1 in the cross section S1. FIG. 3B illustrates a circle C1 having the same area as the cross section of the crystal grain P1. D1 represents a diameter of the circle C1.

Figure 3C:
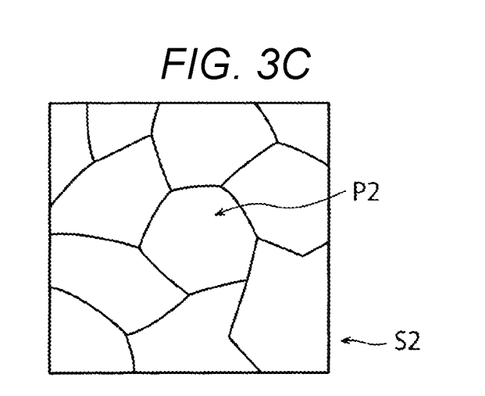
Figure 3D:
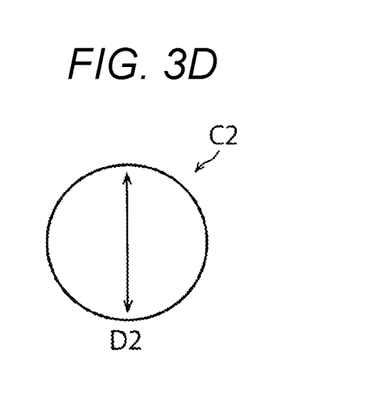

FIG. 3C illustrates a cross section S2 of the channel semiconductor layer 15 in a case where the channel semiconductor layer 15 is crystalized after metal atoms are deposited on the surface thereof. P2 in FIG. 3C represents a certain crystal grain P2 in the cross section S2. FIG. 3D illustrates a circle C2 having the same area as the cross section of the crystal grain P2. D2 represents a diameter of the circle C2.

The particle diameter of the crystal grain P2 of this embodiment is set to be the diameter D2 of the circle C2. For example, a microscopic image of the cross section S2 of the channel semiconductor layer 15 is acquired, the cross-sectional area of the crystal grain P2 in the cross section S2 is calculated using the microscopic image, and the diameter D2 is calculated from the cross-sectional area of the crystal grain P2. Thus, the particle diameter of the crystal grain P2 can be calculated. The cross-sectional area of the crystal grain P2 can be calculated from, for example, the number of pixels in the microscopic image of the crystal grain P2. Similarly, the particle diameter of the crystal grain P1 of this embodiment is set to the diameter D1 of the circle C1.

In at least one embodiment, the particle diameter of each crystal grain in the cross section S2 is calculated, and an average value of the particle diameters of these crystal grains is calculated. Therefore, an average particle diameter of the crystal grains in the channel semiconductor layer 15 can be calculated. The average particle diameter of the crystal grains in the channel semiconductor layer 15 of this embodiment is 2,000 nm or more for example.

FIGS. 4A to 5C are cross-sectional views illustrating a method of manufacturing the semiconductor device of the first embodiment.

Figure 4A:
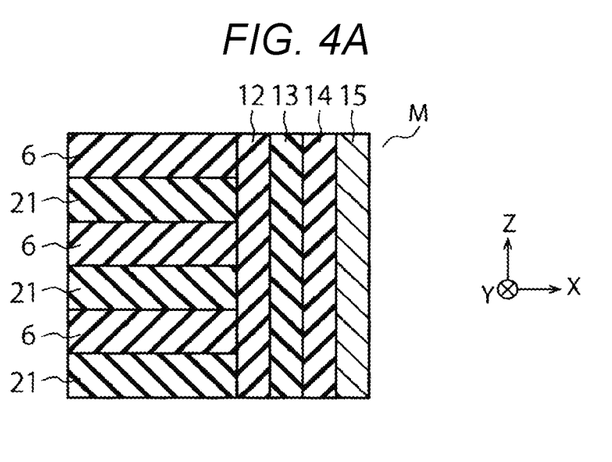
FIGS. 4A to 4C are cross-sectional views illustrating a method of manufacturing the semiconductor device of the first embodiment (1/2)

First, as illustrated in FIG. 1, the lower insulating film 2, the source-side conductive layer 3, and the upper insulating film 4 are formed in this order on the substrate 1. Next, a plurality of sacrifice layers 21 and the plurality of insulating layers 6 are alternately formed on the upper insulating film 4 (FIG. 4A). The sacrifice layer 21 is, for example, a SiN film. The insulating layer 6 is, for example, a SiO$_2$ film as described above. The sacrifice layer 21 is an example of a first film, and the insulating layer 6 is an example of a second film.

The sacrifice layer 21 is replaced with the electrode layer 5 in a later process. However, in a case where the plurality of electrode layers 5 and the plurality of insulating layers 6 are alternately formed in the process illustrated in FIG. 4A, there is no need to replace the sacrifice layer 21 with the electrode layer 5. In this case, the electrode layer 5 also is an example of the first film.

Next, the memory hole M is formed to pass through the sacrifice layers 21 and the insulating layers 6 and reach the substrate 1 (FIG. 4A). Subsequently, the block insulating film 12, the charge storage layer 13, the tunnel insulating film 14, and the channel semiconductor layer 15 are formed in this order on the side surfaces of the sacrifice layers 21 and the insulating layers 6 inside the memory hole M (FIG. 4A).

The channel semiconductor layer 15 illustrated in FIG. 4A is, for example, an amorphous silicon layer. The channel semiconductor layer 15 is formed by Low Pressure Chemical Vapor Deposition (LPCVD) at a temperature of 400° C. to 600° C. and under the pressure of 1 Pa to 500 Pa for example. An example of a source gas of the channel semiconductor layer 15 includes a SiH$_4$ gas, a Si$_2$H$_6$ gas, an organic gas containing Si, and the like (H represents hydrogen). In addition, the thickness of the tunnel insulating film 14 in FIG. 4A is set to 5 nm or more and 10 nm or less.

Figure 4B:
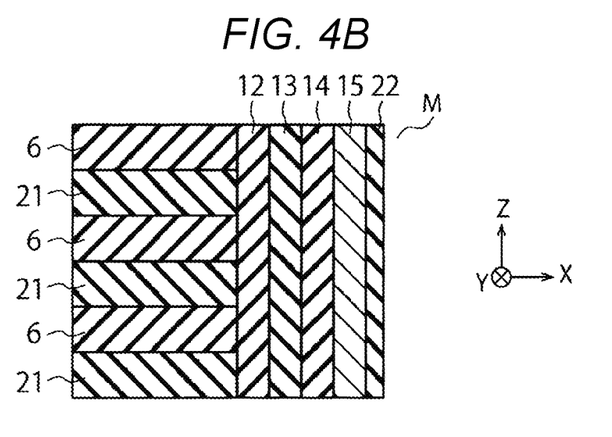

Next, a diffusion layer 22 is formed on the side surface of the channel semiconductor layer 15 (FIG. 4B). The diffusion layer 22 is, for example, an insulating film such as a SiO$_2$ film, a SiN film, a SiON film, a high-k insulating film, an organic insulating film, and the like, and is formed by LPCVD at 300° C. to 600° C.

Figure 4C:
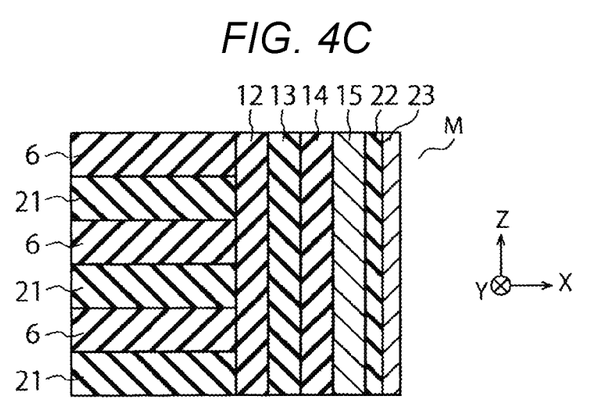

Subsequently, a metal layer 23 is formed on the side surface of the diffusion layer 22 (FIG. 4C). The metal layer 23 is a layer containing metal atoms described above, for example, a Ni layer. The metal layer 23 is formed by Physical Vapor Deposition (PVD) at room temperature, or by CVD at 300° C. to 600° C. using a source gas containing Ni, for example.

Figure 5A:
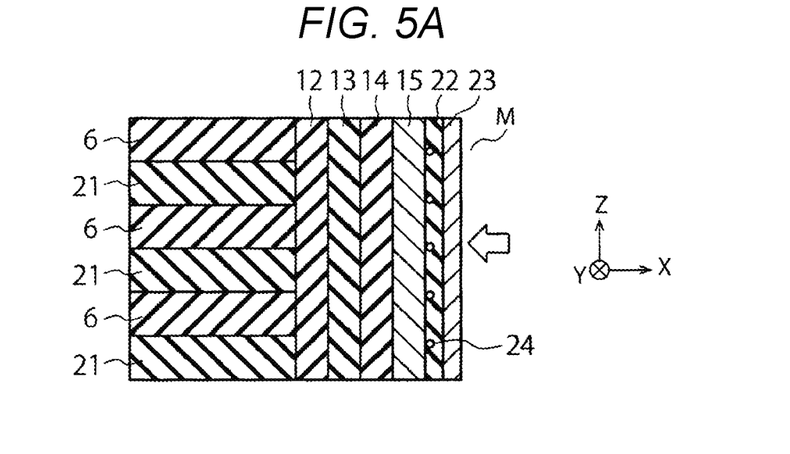
FIGS. 5A to 5C are cross-sectional views illustrating the method of manufacturing the semiconductor device of the first embodiment (2/2)

And then, the channel semiconductor layer 15, the diffusion layer 22, the metal layer 23, and the like are annealed at a temperature of 300° C. to 450° C. and under the pressure of from 100 Pa to atmosphere pressure (FIG. 5A). As a result, the metal atoms 24 in the metal layer 23 pass through the diffusion layer 22 to be diffused toward the channel semiconductor layer 15, thereby being deposited onto the side surface of the channel semiconductor layer 15. The metal atoms 24 of this embodiment are Ni atoms.

Figure 5B:
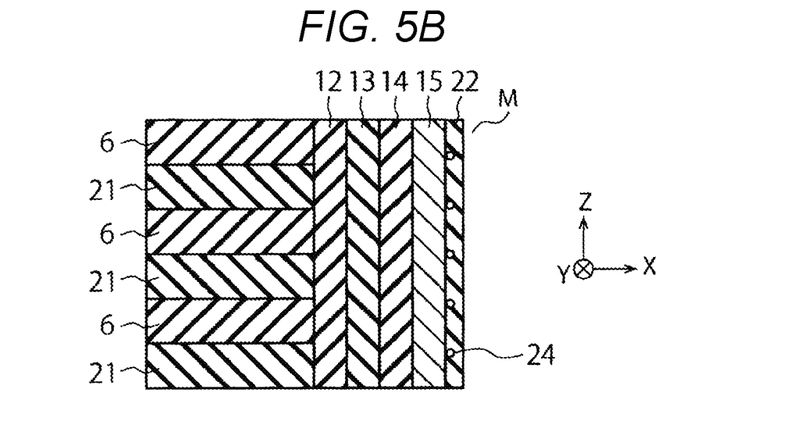

Next, the metal layer 23 is removed from the side surface of the diffusion layer 22 (FIG. 5B). The metal layer 23 is removed using sulfuric acid and hydrogen peroxide solution for example.

Subsequently, the channel semiconductor layer 15 and the like are annealed at a temperature of 500° C. to 600° C. and under the pressure of from 100 Pa to atmosphere pressure (FIG. 5B). As a result, the metal atoms 24 enter the channel semiconductor layer 15, and the channel semiconductor layer 15 is crystallized. The channel semiconductor layer 15 is crystallized, for example, from an amorphous silicon layer into a polysilicon layer.

The channel semiconductor layer 15 is crystallized at 500° C. to 600° C. such that, for example, the concentration of the metal atoms 24 in the channel semiconductor layer 15 becomes $5.0 \times 10^{17}$ [EA/cm$^3$] or higher and $1.3 \times 10^{20}$ [EA/cm$^3$] or lower. Thereby, the channel semiconductor layer 15 can be crystallized such that the particle diameter of the crystal grains in the channel semiconductor layer 15 becomes 2,000 nm or more.

If the amount of the metal atoms 24 deposited on the side surface of the channel semiconductor layer 15 are too small, the concentration of the metal atoms 24 in the channel semiconductor layer 15 will be less than $5.0\times10^{17}$ [EA/cm$^3$]. In this case, the particle diameter of the crystal grains in the channel semiconductor layer 15 will fail to be sufficiently large. On the other hand, if the amount of the metal atoms 24 deposited on the side surface of the channel semiconductor layer 15 is too large, the metal atoms 24 can easily enter the tunnel insulating film 14. In this case, a leakage current may occur in the tunnel insulating film 14. Therefore, the concentration of the metal atoms 24 in the channel semiconductor layer 15 of this embodiment is set to $5.0\times10^{17}$ [EA/cm$^3$] or higher and $1.3\times10^{20}$ [EA/cm$^3$] or lower.

Further, the diffusion layer 22 has an effect of, for example, preventing the metal atoms 24 from diffusing too much from the metal layer 23 to the channel semiconductor layer 15. In addition, since the metal layer 23 is removed in the process of FIG. 5B, it is possible to prevent the metal atoms 24 from diffusing too much from the metal layer 23 to the channel semiconductor layer 15.

Figure 5C:
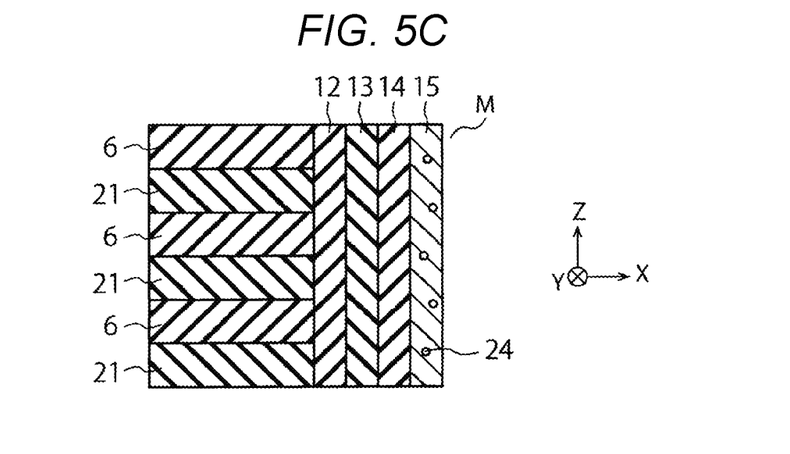

Next, the diffusion layer 22 is removed from the side surface of the channel semiconductor layer 15 (FIG. 5C). Thereafter, the core insulating film 16 is formed on the side surface of the channel semiconductor layer 15 inside the memory hole M. In addition, the sacrifice layer 21 is replaced with the electrode layer 5. Thereby, the semiconductor device illustrated in FIG. 1 is manufactured.

In at least one embodiment, the channel semiconductor layer 15 is crystallized through the annealing at a low temperature (for example, 500° C. to 600° C.), so that crystal grains of a large particle diameter are formed. However, after the crystallization of the channel semiconductor layer 15, the channel semiconductor layer 15 may be annealed to be heated at a high temperature (for example, 900° C. or higher). This also applies to a second embodiment to be described later.

In addition, after crystallization of the channel semiconductor layer 15, the metal atoms 24 may be removed from the channel semiconductor layer 15 by any method. The reason is that crystal grains of a large particle diameter are already formed. On the other hand, as described in at least one embodiment, after the crystallization of the channel semiconductor layer 15, the metal atoms 24 may be left in the channel semiconductor layer 15. Alternatively, after the crystallization of the channel semiconductor layer 15, some of the metal atoms 24 may be removed from the channel semiconductor layer 15, and the remaining metal atoms 24 may be left in the channel semiconductor layer 15. This also applies to the second embodiment, to be described.

As described above, the channel semiconductor layer 15 of at least one embodiment is crystallized at 500° C. to 600° C. such that the concentration of the metal atoms in the channel semiconductor layer 15 becomes $5.0\times10^{17}$ [EA/cm$^3$] or higher and $1.3\times10^{20}$ [EA/cm$^3$] or lower, whereby the particle diameter of the crystal grains in the channel semiconductor layer 15 becomes 2,000 nm or more. Therefore, according to at least one embodiment, it is possible to improve the characteristics of the channel semiconductor layer 15, for example increasing the mobility of the channel semiconductor layer 15.

Second Embodiment

Figure 6A:
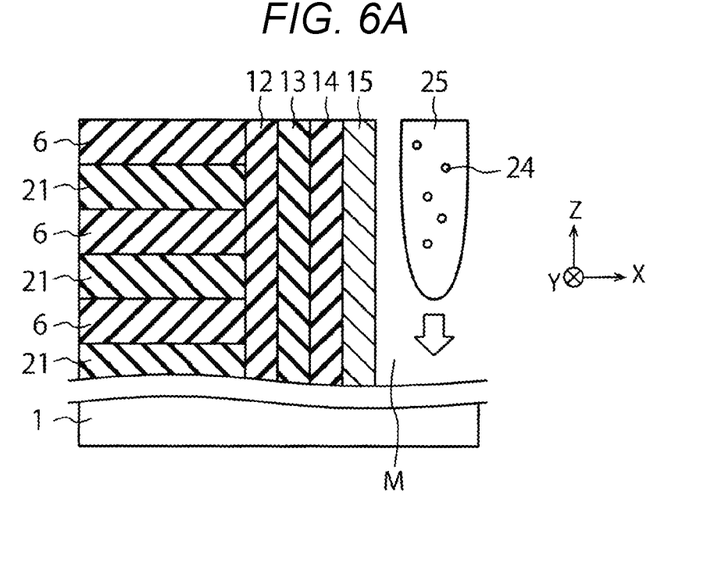
FIGS. 6A and 6B are cross-sectional views illustrating a method of manufacturing a semiconductor device of a second embodiment.
Figure 6B:
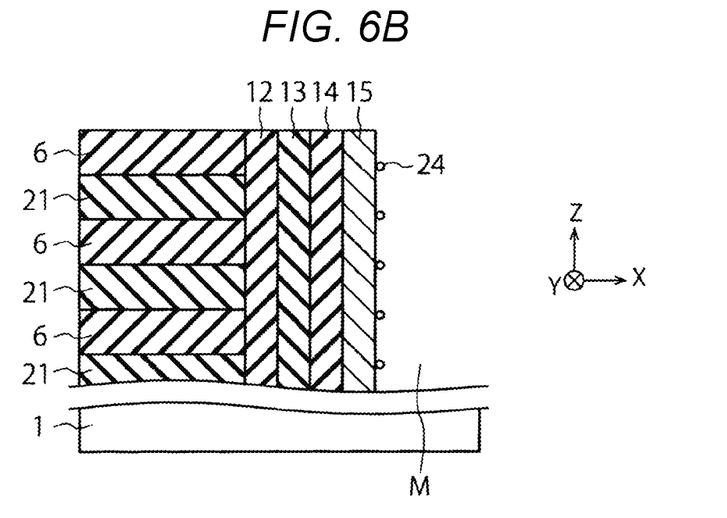

FIGS. 6A and 6B are cross-sectional views illustrating a method of manufacturing a semiconductor device of a second embodiment.

First, similarly to the process illustrated in FIG. 4A, a memory hole M is formed to pass through sacrifice layers 21 and insulating layers 6 to reach a substrate 1 (FIG. 6A). Next, a block insulating film 12, a charge storage layer 13, a tunnel insulating film 14, and a channel semiconductor layer 15 are formed in this order in the side surfaces of the sacrifice layers 21 and the insulating layers 6 inside the memory hole M (FIG. 6A).

The channel semiconductor layer 15 in FIG. 6A is, for example, an amorphous silicon layer. The channel semiconductor layer 15 is formed by LPCVD at a temperature of 400° C. to 600° C. and under the pressure of 1 Pa to 500 Pa for example. An example of the source gas of the channel semiconductor layer 15 includes a $SiH_4$ gas, a $Si_2H_6$ gas, and an organic gas containing Si.

Subsequently, a liquid 25 containing the metal atoms 24 is supplied to the substrate 1. As a result, the liquid 25 enters the memory hole M (FIG. 6A), and the metal atoms 24 in the liquid 25 are deposited on the side surface of the channel semiconductor layer 15 (FIG. 6B). An example of the liquid 25 is an ionic aqueous solution containing Ni ions. Thereafter, the substrate 1 is rinsed with water and then dried with a $N_2$ gas. The two-dimensional concentration of the metal atoms (Ni atoms) 24 deposited on the side surface of the channel semiconductor layer 15 is, for example, $1.0\times10^9$ [EA/cm$^2$] or higher and $1.0\times10^{13}$ [EA/cm$^2$] or lower.

Next, similarly to the process illustrated in FIG. 5B, the channel semiconductor layer 15 and the like are annealed at a temperature of 500° C. to 600° C. and under the pressure of from 100 Pa to atmosphere pressure. As a result, the metal atoms 24 enter the channel semiconductor layer 15, and the channel semiconductor layer 15 is crystallized. The channel semiconductor layer 15 is crystallized, for example, from the amorphous silicon layer to a polysilicon layer.

The channel semiconductor layer 15 is crystallized at 500° C. to 600° C. such that, for example, the concentration of the metal atoms 24 in the channel semiconductor layer 15 becomes $5.0\times10^{17}$ [EA/cm$^3$] or higher, and $1.3\times10^{20}$ [EA/cm$^3$] or lower. Thereby, the channel semiconductor layer 15 can be crystallized such that the particle diameter of the crystal grains in the channel semiconductor layer 15 becomes 2,000 nm or more.

Thereafter, the core insulating film 16 is formed on the side surface of the channel semiconductor layer 15 inside the memory hole M. In addition, the sacrifice layer 21 is replaced with the electrode layer 5. Thereby, the semiconductor device illustrated in FIG. 1 may be manufactured.

As described above, similarly to the first embodiment, the channel semiconductor layer 15 of the second embodiment is crystallized at 500° C. to 600° C. such that the concentration of the metal atoms in the channel semiconductor layer 15 becomes $5.0\times10^{17}$ [EA/cm$^3$] or higher and $1.3\times10^{20}$ [EA/cm$^3$] or lower, whereby the particle diameter of the crystal grains in the channel semiconductor layer 15 becomes 2,000 nm or more. Therefore, according to the second embodiment, it is possible to improve the characteristics of the channel semiconductor layer 15, for example increasing the mobility of the channel semiconductor layer 15.

While certain embodiments have been described, these embodiments have been presented by way of example only, and are not intended to limit the scope of the inventions. Indeed, the novel embodiments described herein may be embodied in a variety of other forms. In addition, various omissions substitutions and changes in the form of the device and the method described in this specification may be made without departing from the spirit of the inventions.

The scope of claims and an equivalent scope are intended to include forms and modifications within the scope and the spirit of the invention.

What is claimed is:

1. A method of manufacturing a semiconductor device comprising:
   forming a plurality of first films and a plurality of second films alternately on a substrate;
   forming a charge storage layer on side surfaces of the first and second films via a second insulating film;
   forming a semiconductor layer on a side surface of the charge storage layer via a first insulating film;
   depositing metal atoms on a surface of the semiconductor layer; and
   annealing the semiconductor layer with the metal atoms deposited on the semiconductor layer, wherein
   the semiconductor layer is crystallized through the annealing such that the concentration of the metal atoms in the semiconductor layer becomes $5.0 \times 10^{17}$ [EA/cm$^3$] or higher and $1.3 \times 10^{20}$ [EA/cm$^3$] or lower, and
   the first insulating film has a thickness of 5 nm or more and 10 nm or less.

2. The method of manufacturing the semiconductor device according to claim 1,
   wherein the semiconductor layer is crystallized through the annealing such that the particle diameter of crystal grains in the semiconductor layer becomes 2,000 nm or more.

3. The method of manufacturing the semiconductor device according to claim 1,
   wherein the semiconductor layer is crystallized by being annealed at 500° C. to 600° C.

4. The method of manufacturing the semiconductor device according to claim 1, further comprising:
   annealing the semiconductor layer at 900° C. or higher after the semiconductor layer is crystallized.

5. The method of manufacturing the semiconductor device according to claim 1,
   wherein a metal layer containing the metal atoms is formed on the surface of the semiconductor layer, and the metal atoms are diffused from the metal layer to the surface of the semiconductor layer, so that the metal atoms are deposited on the surface of the semiconductor layer.

6. The method of manufacturing the semiconductor device according to claim 5,
   wherein the metal layer is formed on the surface of the semiconductor layer via an insulating film.

7. The method of manufacturing the semiconductor device according to claim 1,
   wherein a liquid containing the metal atoms is supplied to the surface of the semiconductor layer, thereby depositing the metal atoms on the surface of the semiconductor layer.

8. A method of manufacturing a semiconductor device comprising:
   depositing metal atoms on a surface of a semiconductor layer;
   annealing the semiconductor layer with the metal atoms deposited on the semiconductor layer; and
   annealing the semiconductor layer at 900° C. or higher after the semiconductor layer is crystallized, wherein
   the semiconductor layer is crystallized through the annealing such that the concentration of the metal atoms in the semiconductor layer becomes $5.0 \times 10^{17}$ [EA/cm$^3$] or higher and $1.3 \times 10^{20}$ [EA/cm$^3$] or lower.

* * * * *